(12) United States Patent
Gary et al.

(10) Patent No.: US 12,156,383 B2
(45) Date of Patent: Nov. 26, 2024

(54) DEVICES, SYSTEMS, AND METHODS FOR A HYBRID COOLING SYSTEM

(71) Applicant: Microsoft Technology Licensing, LLC, Redmond, WA (US)

(72) Inventors: Brandon Earl Gary, Seattle, WA (US); Luke Thomas Gregory, Mercer Island, WA (US); Christy Felix Pradeep Antony, Mississauga (CA)

(73) Assignee: Microsoft Technology Licensing, LLC, Redmond, WA (US)

( * ) Notice: Subject to any disclaimer, the term of this patent is extended or adjusted under 35 U.S.C. 154(b) by 289 days.

(21) Appl. No.: 17/886,318

(22) Filed: Aug. 11, 2022

(65) Prior Publication Data
US 2024/0057296 A1 Feb. 15, 2024

(51) Int. Cl.
*H05K 7/20* (2006.01)

(52) U.S. Cl.
CPC ..... *H05K 7/20772* (2013.01); *H05K 7/20254* (2013.01); *H05K 7/20272* (2013.01); *H05K 7/20336* (2013.01); *H05K 7/2039* (2013.01); *H05K 7/20809* (2013.01)

(58) Field of Classification Search
CPC combination set(s) only.
See application file for complete search history.

(56) References Cited

U.S. PATENT DOCUMENTS

| | | | | |
|---|---|---|---|---|
| 7,599,761 B2 * | 10/2009 | Vinson | ............... | H05K 7/20781 361/698 |
| 8,405,975 B2 * | 3/2013 | Helberg | ................... | G06F 1/203 361/679.55 |
| 9,332,673 B2 * | 5/2016 | Boday | ..................... | F28D 15/02 |
| 11,009,924 B2 * | 5/2021 | Shabbir | ..................... | G06F 1/20 |
| 11,467,637 B2 * | 10/2022 | Cheng | ................ | H05K 7/20509 |
| 11,751,361 B2 * | 9/2023 | Kulkarni | ............ | H05K 7/20809 361/679.47 |
| 11,910,563 B2 * | 2/2024 | Chen | ................... | H05K 7/20772 |
| 12,004,320 B2 * | 6/2024 | Luo | ....................... | G06F 1/1626 |
| 2004/0042184 A1 | 3/2004 | Tomioka | | |
| 2007/0089859 A1 | 4/2007 | Wei | | |
| 2007/0227709 A1 * | 10/2007 | Upadhya | ............ | H05K 7/20154 165/80.4 |
| 2009/0229791 A1 | 9/2009 | Hung | | |
| 2009/0306833 A1 * | 12/2009 | Vinson | ................... | G05D 23/19 700/282 |

(Continued)

OTHER PUBLICATIONS

International Search Report and Written Opinion received for PCT Application No. PCT/US2023/027325, Oct. 25, 2023, 15 pages.

*Primary Examiner* — Lisa Lea-Edmonds
(74) *Attorney, Agent, or Firm* — Ray Quinney & Nebeker P.C.; Paul N. Taylor

(57) ABSTRACT

In some aspects, the techniques described herein relate to a cooling system for a computing device. The cooling system includes an air-cooled cooling system located in a housing. The air-cooled cooling system includes a heat sink thermally connected to a processor, an air-cooling radiator, and a heat pipe connecting the heat sink to the air-cooling radiator. The cooling system includes a liquid-cooled cooling system located in the housing. The liquid-cooled cooling system includes a cold plate thermally connected to a to the heat sink, a pump, a fluid radiator, and a fluid piping system connecting the pump, the cold plate, and the fluid radiator.

20 Claims, 8 Drawing Sheets

(56) References Cited

U.S. PATENT DOCUMENTS

2012/0087088 A1\* 4/2012 Killion ...................... F28F 3/12
165/104.25
2024/0057296 A1\* 2/2024 Gary .................... H05K 7/2039

\* cited by examiner

DEVICES, SYSTEMS, AND METHODS FOR A HYBRID COOLING SYSTEM

CROSS-REFERENCE TO RELATED APPLICATIONS

N/A.

BACKGROUND

Computing devices include one or more heat-generating components. During operation, performance of computing device is best met in cooler environments and below the temperature limits of computing device. In some situations, performance of the computing device may be degraded, or the computing device may be damaged, if the heat-generating components temperature rises too far. A computing device typically includes a cooling system to reduce the heat-generating component to an operating temperature. Examples of cooling systems include air-cooled cooling systems and liquid-cooled cooling systems.

BRIEF SUMMARY

In some aspects, the techniques described herein relate to a cooling system for a computing device. The cooling system includes an air-cooled cooling system located in a housing. The air-cooled cooling system includes a heat sink thermally connected to a processor, an air-cooling radiator, and a heat pipe connecting the heat sink to the air-cooling radiator. The cooling system includes a liquid-cooled cooling system located in the housing. The liquid-cooled cooling system includes a cold plate thermally connected to a to the heat sink, a pump, a fluid radiator, and a fluid piping system connecting the pump, the cold plate, and the fluid radiator.

In some aspects, the techniques described herein relate to a computing system. The computing system includes a housing and a heat-generating component located in the housing. A heat sink is thermally connected to the heat-generating component. An air-cooling radiator is located in the housing and is thermally connected to the heat-generating component via a heat pipe enclosed in a hot plate. A cold plate is thermally connected to or integrated into the hot plate for additional cooling. A fluid radiator is located in the housing, the fluid radiator being thermally connected to the heat-generating component though a fluid piping system.

In some aspects, the techniques described herein relate to a method for cooling a computing device. The method includes cooling a heat-generating component using an air-cooled cooling system, the air-cooled cooling system including a heat sink thermally connected to the heat-generating component and an air-cooling radiator thermally connected to the heat sink through a heat pipe, the air-cooled cooling system being located in a housing. The heat-generating component is cooled using a liquid-cooled cooling system, the liquid-cooled cooling system including a cold plate thermally connected to the heat sink's hot plate housing the heat pipes, the liquid-cooled cooling system being located in the housing.

This summary is provided to introduce a selection of concepts that are further described below in the detailed description. This summary is not intended to identify key or essential features of the claimed subject matter, nor is it intended to be used as an aid in limiting the scope of the claimed subject matter.

Additional features and advantages of embodiments of the disclosure will be set forth in the description which follows, and in part will be obvious from the description, or may be learned by the practice of such embodiments. The features and advantages of such embodiments may be realized and obtained by means of the instruments and combinations particularly pointed out in the appended claims. These and other features will become more fully apparent from the following description and appended claims, or may be learned by the practice of such embodiments as set forth hereinafter.

BRIEF DESCRIPTION OF THE DRAWINGS

In order to describe the manner in which the above-recited and other features of the disclosure can be obtained, a more particular description will be rendered by reference to specific implementations thereof which are illustrated in the appended drawings. For better understanding, the like elements have been designated by like reference numbers throughout the various accompanying figures. While some of the drawings may be schematic or exaggerated representations of concepts, at least some of the drawings may be drawn to scale. Understanding that the drawings depict some example implementations, the implementations will be described and explained with additional specificity and detail through the use of the accompanying drawings in which:

FIG. 4-1 is a representation of a top-down view of a computing device, according to at least one embodiment of the present disclosure;

FIG. 4-2 is a representation of a cross-sectional view of the computing device of FIG. 4-1;

DETAILED DESCRIPTION

Figure 1:
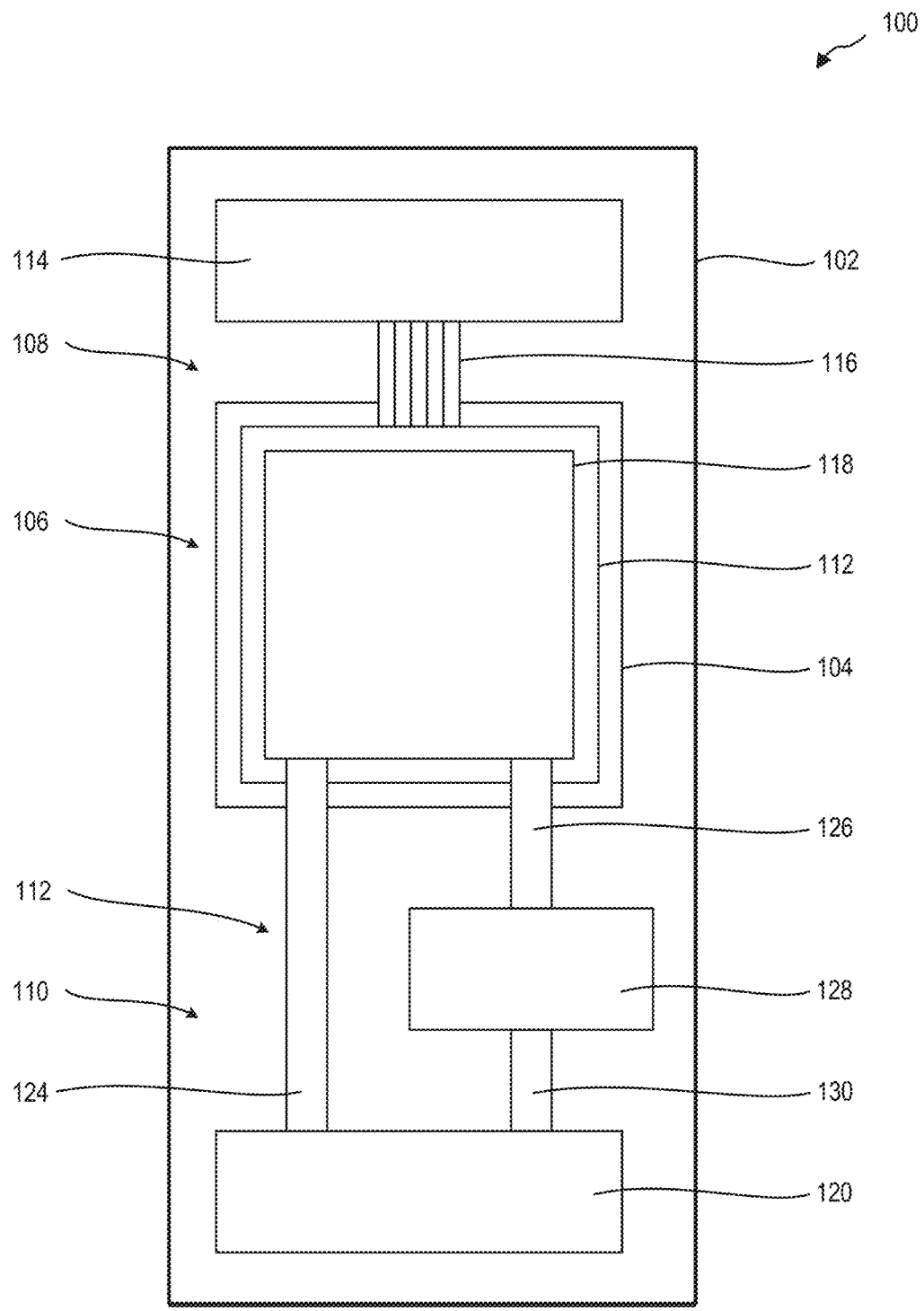
FIG. 1 is a representation of a top-down view of a computing device, according to at least one embodiment of the present disclosure.

This disclosure generally relates to devices, systems, and methods for a hybrid air-cooled and liquid-cooled cooling systems for a computing system. Computing systems generate heat, and as heat-generating computing components have decreased in size and/or increased in capacity, the heat generated per square millimeter has increased. To maintain low operating temperatures of the computing system, cooling systems are connected to the heat-generating computing components. Cooling systems may include any type of cooling system, including air-cooled and liquid-cooled. In an air-cooled cooling system, heat may be removed from the heat-generating computing component using a flow of air. In some situations, the air is passed directly over the heat-generating component. In some situations, the heat is transferred to an air radiator through a series of thermally conductive elements, heat pipes, or other mechanism. Air-cooled computing systems may be installed in the housing of a computing device, such as in a server tray installed in a server rack. But air has a limited capacity to transfer heat, which may limit the cooling capacity of an air-cooled cooling system. In some situations, the cooling capacity of an air-cooled cooling system is less than the heat generation of the heat-generating component. This may result in the computing system being damaged due to high heat and/or throttled to reduce the heat generation.

Liquid-cooled cooling systems may include a cold plate that is thermally connected to a heat-generating component. Cold water may be pumped into the cold plate, absorb the heat from the heat-generating component, and pumped to a liquid-cooling radiator or heat exchanger. Conventionally, a liquid-cooled cooling system includes one or more components that are external to the housing of the computing component. For example, the liquid-cooled cooling system may include a coolant tank, coolant heat exchanger, pump, piping, any other components, and combinations thereof, that are located outside of the housing of the computing system. A server tray may include connections to a liquid-cooled cooling system, and a technician and/or an operator may connect and disconnect the cooling system to the server tray each time the server tray is installed and/or removed. In some situations, liquid-cooled cooling systems may involve specific infrastructure, and a computing system may not utilize liquid-cooling without being installed in a particular rack and/or datacenter having the liquid-cooling infrastructure. This may limit the applicability of liquid cooling.

In accordance with at least one embodiment of the present disclosure, a hybrid air-cooled and liquid-cooled cooling system (e.g., hybrid cooling system) includes an air-cooled cooling system and a liquid-cooled cooling system in the same housing. A heat sink may be thermally connected to a heat-generating component. The heat sink may absorb heat from the heat-generating component. One or more heat pipes may transfer heat from the heat-generating component to a first radiator. The first radiator may be air-cooled. The hybrid cooling system may further include a liquid-cooled cooling system. The liquid-cooled cooling system may include a cold plate that is thermally connected to the heat sink (the cold plate may be thermally connected to the heat-generating component through the heat sink). The liquid-cooled cooling system may absorb heat from the heat sink with a cooling fluid and transfer the heated cooling fluid to a second radiator. In this manner, the liquid-cooled cooling system may absorb additional heat from the heat sink, or heat in excess of the heat absorbed by the air-cooled cooling system, thereby improving the performance of the heat-generating components.

In some embodiments, the liquid-cooled cooling system is located within (e.g., entirely within) the housing of the computing system. For example, the liquid-cooled cooling system may be a closed-loop system within the housing. This may allow the computing systems discussed herein to be utilized with any infrastructure. For example, a server tray including one or more of the hybrid cooling systems discussed herein may be used in a standard rack, or a rack that does not include any liquid cooling system infrastructure. In this manner, the hybrid cooling systems discussed herein may provide improved cooling to cooling in existing infrastructure.

As illustrated by the foregoing discussion, the present disclosure utilizes a variety of terms to describe features and advantages of the hybrid cooling system. Additional detail is now provided regarding the meaning of such terms. For example, as used herein, the term "heat-generating component" refers to any component of a computing system that generates heat. To illustrate, a heat-generating component can include processors, circuits, integrated circuits (ICs), application-specific integrated circuits (ASIC), switches, transistors, field-programmable gate arrays (FPGAs), antennas, receivers, memory, random-access memory (RAM), dynamic random-access memory (DRAM), static random-access memory (SRAM), read-only memory (ROM), dual in-line memory modules (DIMMs), energy storage devices, batteries, supercapacitors, any other heat-generating component, and combinations thereof. A heat-generating component that generates more heat may be associated with a higher-performing heat-generating component. For example, a faster heat-generating component may generate more total heat. In some examples, a smaller heat-generating component may have a higher heat flux, resulting in a higher rate of cooling to maintain operating temperatures.

As used herein, the term "thermally connected" refers to a connection between two components that facilitates the transfer of heat between the two components. Two thermally connected components may be in direct contact (e.g., without any intervening material). Two thermally connected components may have one or more thermal connectors between them. The thermal connector may be a thermally conductive material, or a material that facilitates the transfer of heat through its mass. For example, two thermally connected components may include a thermal interface material (TIM) between the two components. A TIM may be a material, such as a flowable paste formed from thermally conductive materials, that may be inserted between two components to reduce or eliminate the presence of air gaps and other insulating material. In some embodiments, two thermally connected components may be separated from each other. For example, a thermal connector such as a heat pipe may thermally connect two components across a distance.

FIG. 1 is a representation of a top-down view of a computing device 100, according to at least one embodiment of the present disclosure. The computing device 100 includes a housing 102. A heat-generating component 104 is located in the housing 102. During operation of the computing device 100, the heat-generating component 104 may generate heat. The heat-generating component 104 may be cooled by a hybrid cooling system 106. The hybrid cooling system 106 includes an air-cooled cooling system 108 and a liquid-cooled cooling system 110.

The air-cooled cooling system 108 may include a heat sink 112 that is thermally connected to the heat-generating component 104. The heat-generating component 104 may transfer generated heat to the heat sink 112. The heat sink 112 may be thermally connected to an air-cooling radiator 114. For instance, in the embodiment shown, the heat sink 112 is connected to the air-cooling radiator 114 with one or more heat pipes 116. A heat pipe 116 may be a thermal connector that includes a pipe having an enclosed volume. A phase-change material may be located in the thermal volume. The heat pipes 116 may extend into the heat sink 112 and absorb heat from the heat sink 112. The absorbed heat may cause the phase-change material to change phase, such as from liquid to gas.

The gaseous phase-change material may travel through the heat pipes 116 to the air-cooling radiator 114, and the air-cooling radiator 114 may absorb heat from the heat pipes 116, causing the gaseous phase-change material to condense back into a liquid. The air-cooling radiator 114 may release the absorbed heat into the atmosphere. For example, the air-cooling radiator 114 may include one or more fins. One or more fans may blow air across the fins of the air-cooling radiator 114, and the blowing air may absorb the heat from the air-cooling radiator 114. In this manner, the air-cooled cooling system 108 may cool the heat-generating component 104.

As discussed herein, the air-cooled cooling system 108 may be located within the housing 102. For example, the air-cooled cooling system 108 may be entirely located within the housing 102, and the housing 102 may include ventilation paths for air flow to flow across the air-cooling radiator 114, including openings in the housing 102 for ventilation air to enter and exit the housing 102. The air-cooled cooling system 108 may be connected to the power system for the computing device 100. In this manner, when the computing device 100 is connected to power and operating, the air-cooled cooling system 108 may be operable.

In accordance with at least one embodiment of the present disclosure, the hybrid cooling system 106 includes the liquid-cooled cooling system 110. The liquid-cooled cooling system 110 includes a cold plate 118. The cold plate 118 may be thermally connected to the heat sink 112. For example, the cold plate 118 may be connected to the heat sink 112 with a TIM or other thermal connector. In the embodiment shown, the heat sink 112 and the cold plate 118 are stacked vertically (e.g., into and out of the page of FIG. 1) on top of the heat-generating component 104. For clarity of illustration, the heat-generating component 104 is shown has having a larger extent or area than the heat sink 112, and the heat sink 112 is shown as having a larger extent or area than the cold plate 118. However, it should be understood that the heat-generating component 104, the heat sink 112, and the cold plate 118 may have the same or similar extents.

The liquid-cooled cooling system 110 includes a pump 120 and a fluid piping system 122. The liquid-cooled cooling system 110 may flow a cooling fluid through the fluid piping system 122 and the cold plate 118. For example, the fluid piping system 122 includes a cold fluid line 124 that may flow into the cold plate 118. The cold fluid may absorb heat from the cold plate 118, resulting in hot fluid. The hot fluid may flow out of the cold plate 118 through a hot fluid line 126. The hot fluid line 126 may be directed away from the cold plate 118. For example, the hot fluid line 126 may direct the hot fluid to a fluid radiator 128. The fluid radiator 128 may cool the hot fluid, and the cooled fluid may be pumped back into the cold plate 118. In this manner, the liquid-cooled cooling system 110 may cool the heat-generating component 104 by absorbing heat from the heat sink 112, which heat is absorbed from the heat-generating component 104.

In accordance with at least one embodiment of the present disclosure, the liquid-cooled cooling system 110 provides additional cooling to the heat-generating component 104 combined with the air-cooled cooling system 108. Because the cold plate 118 is thermally connected to the heat sink 112, the cold plate 118 may absorb heat from the heat sink 112. This may allow the heat sink 112 to absorb additional heat from the heat-generating component 104, thereby allowing the heat-generating component 104 to generate more heat.

The liquid-cooled cooling system 110 may be located within the housing 102. In some embodiments, the entirety of the liquid-cooled cooling system 110 is located within the housing 102. For example, each component of the liquid-cooled cooling system 110 may be located within the housing, including the cold plate 118, the fluid piping system 122, the pump 120, and the fluid radiator 128. In this manner, the liquid-cooled cooling system 110 may be installed in locations that do not have existing liquid cooling infrastructure. This may allow the computing device 100 to use a heat-generating component 104 that generates more heat. In this manner, the computing device 100 may be upgraded (e.g., with a heat-generating component 104 that produces additional heat) without upgrading the underlying supporting infrastructure. The liquid-cooled cooling system 110 may be connected to the power system for the computing device 100. In this manner, when the computing device 100 is connected to power and operating, the liquid-cooled cooling system 110 may be operable.

In accordance with at least one embodiment of the present disclosure, the liquid-cooled cooling system 110 is a closed-loop system. Cooling fluid may flow from the cold plate 118 and the fluid radiator 128 and back without traveling to an external tank, being removed from the computing device 100, or otherwise leaving the liquid-cooled cooling system 110. A closed-loop liquid-cooled cooling system 110 may allow the liquid-cooled cooling system 110 to include the liquid-cooled cooling system 110 without a connection to any external liquid cooling infrastructure.

In some embodiments, the air-cooling radiator 114 of the air-cooled cooling system 108 and the fluid radiator 128 of the liquid-cooled cooling system 110 are cooled in different cooling flows. For example, a first air flow may blow over the air-cooling radiator 114 to cool the air-cooling radiator 114. In some examples, a second air flow may blow over the fluid radiator 128 to cool the fluid radiator 128. Because air has a limited capacity to absorb heat, the air-cooling radiator 114 and the fluid radiator 128 may be on different air flows. Because the heat in the liquid-cooled cooling system 110 is stored in the cooling fluid, the cooling fluid of the liquid-cooled cooling system 110 may transfer the heat further away from the heat-generating component 104 than the air-cooled cooling system 108. This may allow the fluid radiator 128 to be located in a location where it may be cooled using a different air flow than the air-cooling radiator 114. In this manner, the cooling capacity of the hybrid cooling system 106 may be increased with both the air-cooled cooling system 108 and the liquid-cooled cooling system 110.

In the embodiment shown, the pump 120 may pump the cooling fluid into the cold fluid line 124. The cold fluid line 124 may be an inlet to the cold plate 118. After absorbing heat on the cold plate 118, the hot fluid may pass out of the cold plate 118 in the hot fluid line 126. The hot fluid line 126 may be an outlet to the cold plate 118. The hot fluid line 126 may flow into the fluid radiator 128, where the hot cooling fluid may be cooled. The cooled fluid may then travel back into the pump 120 through a pump inlet 130. In this manner, as discussed herein, the liquid-cooled cooling system 110 may be a closed-loop system. Put another way, the pump 120 may push the cooling fluid through cold fluid line 124 to cause cooling fluid to flow into the cold plate 118, out of the cold plate 118 in the hot fluid line 126, into the fluid radiator 128, out of the fluid radiator 128 in the pump inlet 130, and back to the pump 120. The cooling fluid may indefinitely loop through this circuit.

In accordance with at least one embodiment of the present disclosure, the liquid-cooled cooling system 110 is independently actuatable. For example, the pump 120 may be turned on and off to actuate or implement the liquid-cooled cooling system 110. In some embodiments, the liquid-cooled cooling system 110 is actuated based on one or more criteria. For example, the liquid-cooled cooling system 110 may be actuated based on a heat generation of the heat-generating component 104. If the heat generation increases above a heat generation threshold, the hybrid cooling system 106 may actuate the liquid-cooled cooling system 110 to provide additional cooling. The heat generation threshold may be based on the cooling capacity of the air-cooled cooling system 108. The heat generation threshold may be equal to cooling capacity of the air-cooled cooling system 108. The heat generation threshold may be less than the cooling capacity of the air-cooled cooling system 108 to provide a buffer or safety margin in the cooling capacity of the hybrid cooling system 106 before the liquid-cooled cooling system 110 is actuated.

For example, the heat-generating component 104 may include a processor, and a processing speed or frequency of the processor may determine a heat generation of the heat-generating component 104. In some examples, the heat-generating component 104 may include a DIMM, and the heat generation of the DIMM may be based on the rate of memory storage in the DIMM.

In some examples, the liquid-cooled cooling system 110 may be actuated based on a temperature of one or more components of the computing device 100. The computing device 100 may be actuated based on a temperature of the heat-generating component 104, the heat sink 112, the cold plate 118, any other component of the computing device 100, and combinations thereof. If the measured temperature is above a temperature threshold, then the liquid-cooled cooling system 110 may be actuated. In some embodiments, the temperature is directly measured. For example, a temperature sensor may be located at the heat-generating component 104, the heat sink 112, the cold plate 118, or at any other location where the temperature is measured. Directly measuring the temperature may allow for fast and accurate temperature measurements and actuation of the liquid-cooled cooling system 110. In some embodiments, the temperature is indirectly measured, or is determined based on measurements located remotely from the heat-generating component 104, the heat sink 112, the cold plate 118, or other component of interest. In some situations, directly measuring the temperature of the computing component may be difficult or impossible, based on the geometry of the computing device 100 and/or other practical considerations. The temperature may be measured at a location removed from the component of interest, and the temperature at the component of interest may be inferred.

Figure 2:
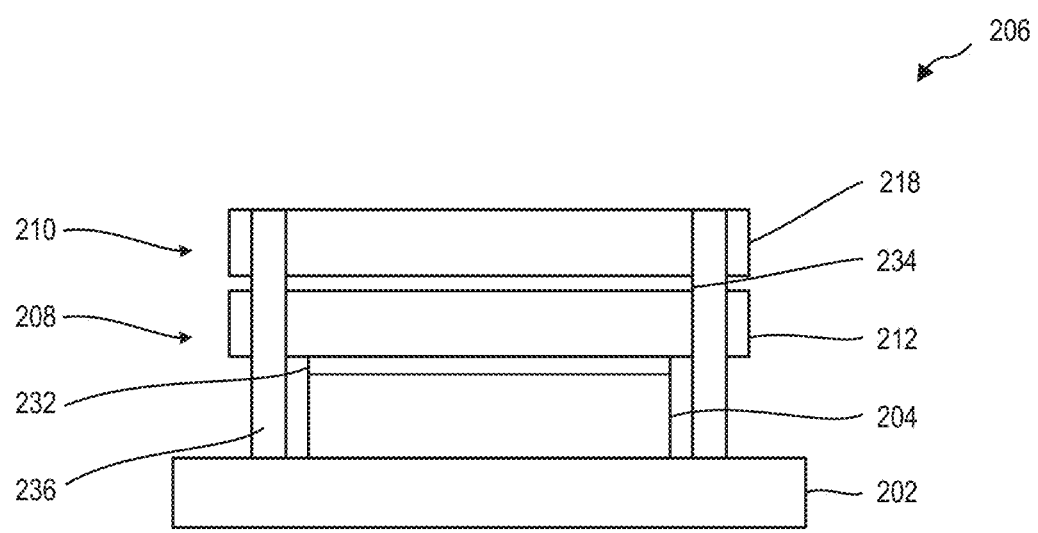
FIG. 2 is a representation of a cross-sectional view of a hybrid cooling system, according to at least one embodiment of the present disclosure.

FIG. 2 is a representation of a cross-sectional view of a hybrid cooling system 206, according to at least one embodiment of the present disclosure. The hybrid cooling system 206 includes an air-cooled cooling system 208 and a liquid-cooled cooling system 210. The hybrid cooling system 206 includes a heat sink 212 thermally connected to a heat-generating component 204. The heat sink 212 may be thermally connected to the heat-generating component 204 with a first thermal connector 232. The first thermal connector 232 shown is a TIM. The TIM may be flowed into a gap between the heat-generating component 204 and the heat sink 212. The TIM may fill the gap to reduce or remove any air pockets in the gap, thereby improving the thermal connection between the heat-generating component 204 and the heat sink 212.

The liquid-cooled cooling system 210 includes a cold plate 218 thermally connected to the heat sink 212 with a second thermal connector 234. The second thermal connector 234 shown is a TIM. The TIM may be flowed into a gap between the heat sink 212 and the cold plate 218. The TIM may fill the gap to reduce or remove any air pockets in the gap, thereby improving the thermal connection between the heat-generating component 204 and the heat sink 212.

In the embodiment shown, the heat sink 212 and the cold plate 218 are vertically stacked on top of the heat-generating component 204. This may help to improve the thermal connection and transfer of heat from the heat-generating component 204 to the heat sink 212 and the cold plate 218.

The heat sink 212 and the cold plate 218 are connected to a housing 202 using one or more mechanical fasteners 236. A single mechanical fastener 236 may extend through a cold plate bore in the cold plate 218 and a heat sink bore in the heat sink 212. The cold plate bore and the heat sink bore may be coaxial. Put another way, the mechanical fastener 236 may extend through both the cold plate bore and the heat sink bore. In this manner, a single mechanical fastener (or a set of mechanical fasteners) may secure both the heat sink 212 and the cold plate 218 to the housing.

In some embodiments, the heat sink 212 and the cold plate 218 form a single assembly, or a single field replaceable unit (FRU). For example, the heat sink 212 and the cold plate 218 may be formed as a single structure. During installation and/or replacement, the heat sink 212 and the cold plate 218 may be installed and/or replaced as a single unit. This may help to improve the ease of maintenance of the hybrid cooling system 206.

Figure 3:
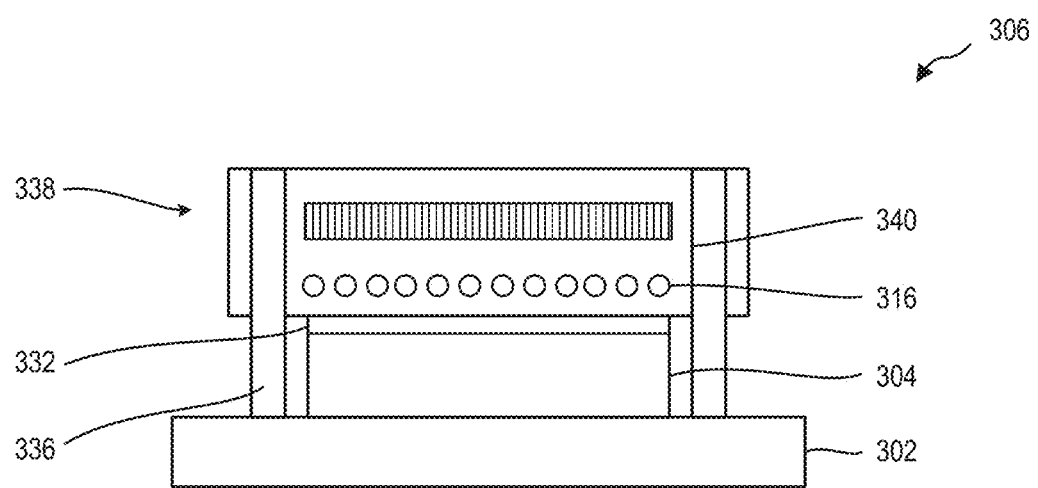
FIG. 3 is a representation of a cross-sectional view of a hybrid cooling system, according to at least one embodiment of the present disclosure.

FIG. 3 is a representation of a cross-sectional view of a hybrid cooling system 306, according to at least one embodiment of the present disclosure. The hybrid cooling system 306 includes a cooling plate 338. The cooling plate 338 may be part both an air-cooled cooling system and a liquid-cooled cooling system. Put another way, the cooling plate 338 may include both a heat sink from an air-cooled cooling system that is integrally formed (e.g., formed from the same material, formed as a single mass without a joint or separation) with a cold plate from a liquid-cooled cooling system.

The cooling plate 338 may be thermally connected to a heat-generating component 304 with a thermal connector 332. The thermal connector 332 shown is a TIM. The TIM may be flowed into a gap between the heat-generating component 304 and the cooling plate 338. The TIM may fill the gap to reduce or remove any air pockets in the gap, thereby improving the thermal connection between the heat-generating component 304 and the cooling plate 338. In this manner, the cooling plate 338 may absorb heat from the heat-generating component 304. Put another way, the heat-generating component 304 may transfer generated heat to the cooling plate 338.

The cooling plate 338 may include one or more heat pipes 316 that extend into a body of the cooling plate 338. The heat pipes 316 may be located proximate to the heat-generating component 304 (e.g., the one or more heat pipes 316 may be located proximate to the thermal connector 332 and/or the connection between the cooling plate 338 and the heat-generating component 304). The one or more heat pipes 316 may be part of an air-cooled cooling system. The one or more heat pipes 316 may absorb heat from the cooling plate 338 and transfer the heat to an air-cooling radiator.

The cooling plate 338 may include a liquid absorption panel 340. Cooling fluid from a liquid-cooled cooling system may pass through the liquid absorption panel 340. Heat in the cooling plate 338 may be transferred to the cooling fluid in the liquid absorption panel 340. In this manner, the liquid-cooled cooling system may provide additional cooling to the heat-generating component 304.

By integrally forming the heat sink with the cold plate into a cooling plate 338, the hybrid cooling system 306 may provide improved thermal transfer through the cooling plate 338. This may help to reduce thermal resistance between the air-cooled cooling system and the liquid-cooled cooling system, thereby improving the efficiency of the hybrid cooling system 306.

The cooling plate 338 may be secured to a housing 302 with one or more mechanical fasteners 336. The mechanical fasteners 336 may secure the cooling plate 338 to the heat-generating component 304. As discussed herein, securing the cooling plate 338 to the housing 302 with the mechanical fasteners 336 may improve the ease of installation and/or replacement by having a single component to be installed and/or replaced.

Figures 1, 4:
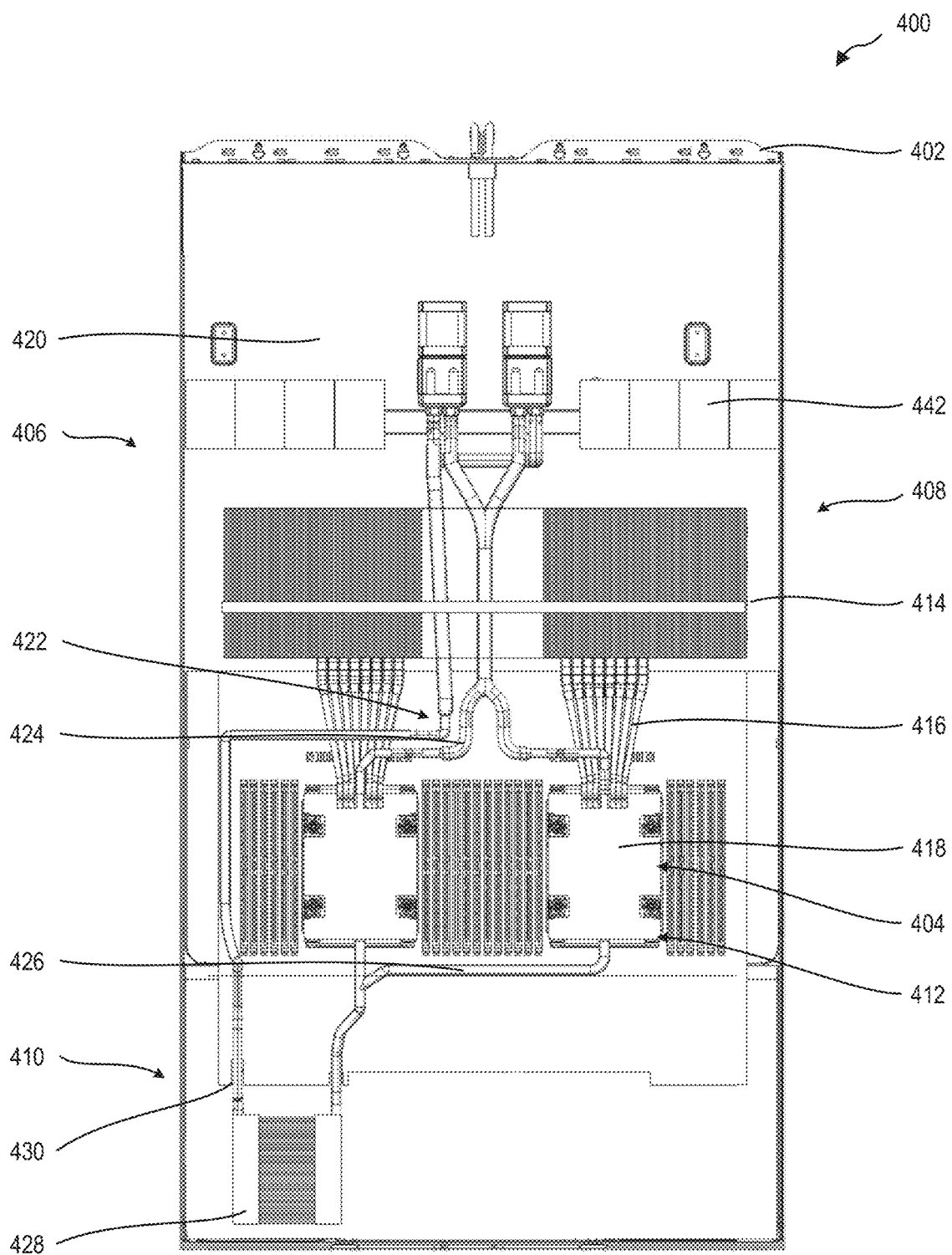
Figures 2, 4:
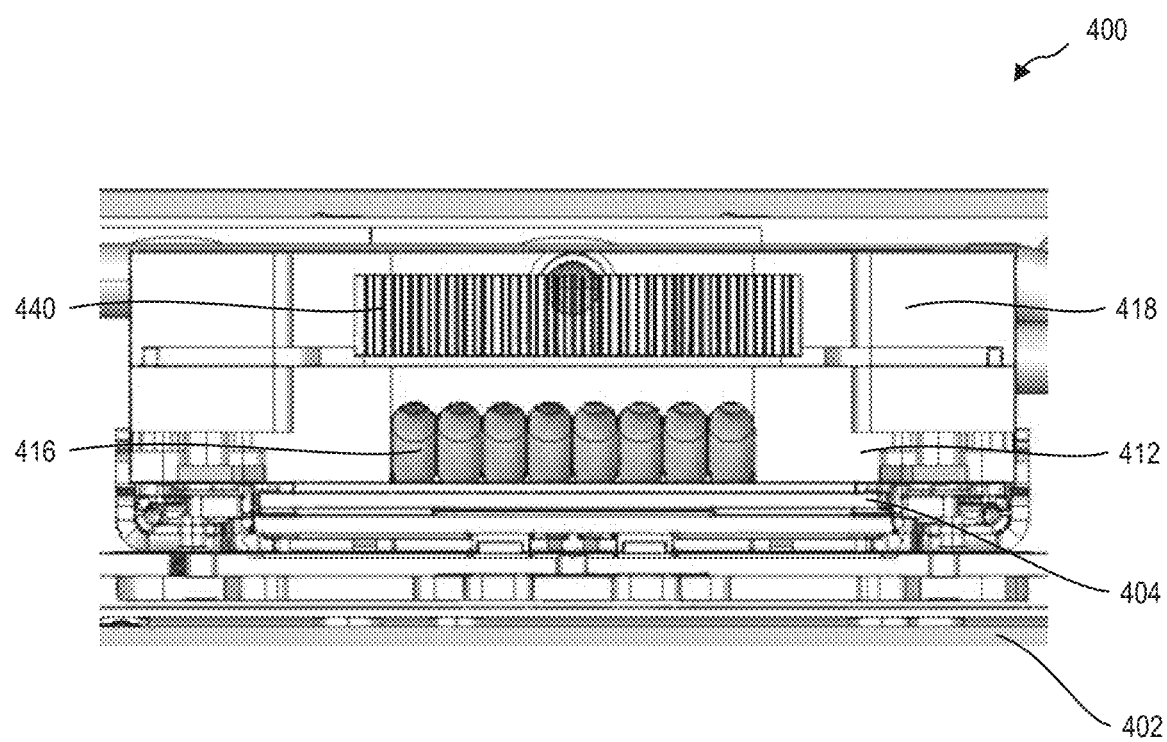

FIG. 4-1 is a representation of a top-down view of a computing device 400 having an upper plate of a housing 402 removed therefrom, according to at least one embodiment of the present disclosure. The computing device 400 includes a heat-generating component 404 located in the housing 402. The computing device 400 is cooled using a hybrid cooling system 406. The hybrid cooling system 406 includes an air-cooled cooling system 408 and a liquid-cooled cooling system 410. The air-cooled cooling system 408 includes a heat sink 412 thermally connected to the heat-generating component 404. The liquid-cooled cooling system 410 includes a cold plate thermally connected to the heat sink 412. In some embodiments, the heat sink 412 and the cold plate 418 are both thermally connected to the heat-generating component 404.

In the embodiment shown in FIG. 4-1, the computing device 400 includes two heat-generating components 404. However, it should be understood that the computing device 400 may include any number of heat-generating components 404, such as 1, 2, 3, 4, 5, 6, 7, 8, 9, 10, or more heat-generating components 404. In some embodiments, a single heat-generating component 404 may be thermally connected to the heat sink 412 and the cold plate 418. In some embodiments, multiple heat-generating components 404 may be thermally connected to the heat sink 412 and the cold plate 418.

The air-cooled cooling system 408 includes an air-cooling radiator 414 connected to the heat sink 412 through one or more heat pipes 416. The heat pipes 416 may transfer heat from the heat sink 412 to the air-cooling radiator 414. The air-cooled cooling system 408 may include one or more fans 442 located proximate to the air-cooling radiator 414 and oriented to blow a flow of ventilation air across the air-cooling radiator 414. The flow of ventilation air may absorb heat from the air-cooling radiator 414 and pass out of the housing 402, thereby removing the heat from the housing 402.

In the embodiment shown, the entirety of the air-cooled cooling system 408 is located within the housing 402. Each component of the air-cooled cooling system 408 may be located in the housing 402, including the heat sink 412, the one or more heat pipes 416, the air-cooling radiator 414, and the fans 442. The powered elements of the air-cooled cooling system 408 may be connected to the power system of the computing device 400. For example, the fans 442 may be connected to the same power system that the heat-generating component 404 is connected to. In this manner, when the computing device 400 is connected to power and operation, the air-cooled cooling system 408 may be powered and operational without connection to any other external cooling system.

The liquid-cooled cooling system 410 includes a pump 420 connected to the cold plate 418 and a fluid radiator 428 with a fluid piping system 422. For example, a cold fluid line 424 may be an inlet to the cold plate 418 from the pump 420. The pump 420 may pump cold cooling fluid to the cold plate 418 through the cold fluid line 424. Hot cooling fluid may exit the cold plate 418 and flow to the fluid radiator 428 in a hot fluid line 426. The fluid radiator 428 may cool the cooling fluid back to an operating temperature. A pump inlet 430 may return the cooling fluid from the fluid radiator 428 to the pump 420.

In some embodiments, the air-cooling radiator 414 and the fluid radiator 428 are located on opposite sides of the heat-generating component 404. This may allow the fluid radiator 428 and the air-cooling radiator 414 to be separately cooled, so that the cooling capacity of one is not diminished by the other's presence. In some embodiments, the distance the air-cooling radiator 414 is located away from the heat-generating component 404 may be determined by the ability of the heat pipes 416 to transport heat over a distance. This may limit the distance that the air-cooling radiator 414 may be located away from the heat-generating component 404. Because the cooling fluid is actively transported by the pump 420, the fluid radiator 428 may be located further away from the heat-generating component 404. In this manner, the components of the liquid-cooled cooling system 410 may be installed in the housing 402 based on the particular geometry and layout of the computing device 400. For example, in the embodiment shown, the pump 420 is located on an opposite side of the heat-generating component 404 than the fluid radiator 428, with the fluid piping system 422 connecting the elements of the liquid-cooled cooling system 410 to each other.

As may be seen, the liquid-cooled cooling system 410 is located entirely within the housing 402. As discussed herein, locating the liquid-cooled cooling system 410 and the air-cooled cooling system 408 within the housing 402 may allow the computing device 400 to be used in any location, even locations without pre-existing infrastructure for either the liquid-cooled cooling system 410 or the air-cooled cooling system 408.

FIG. 4-2 is a cross-sectional view of the computing device 400 of FIG. 4-1. As may be seen, the heat sink 412 may be located on top of the heat-generating component 404 and the cold plate 418 may be located on top of the heat sink 412. The heat sink 412 may absorb heat from the heat-generating component 404, and the cold plate 418 may absorb heat from the heat sink 412. In this manner, the heat sink 412 may absorb more heat from the heat-generating component 404, thereby increasing the cooling capacity of the hybrid cooling system 406.

As may be seen, the heat sink 412 includes a plurality of heat pipes 416 that extend into a body of the heat sink 412. The heat pipes 416 may absorb heat from the heat sink 412 and/or from the heat-generating component 404. The cold plate 418 may include a liquid absorption panel 440 that extends through a body of the cold plate 418. The cooling fluid may be flowed through the liquid absorption panel 440. The cooling fluid may absorb heat from the cold plate 418 and be pumped out of the liquid absorption panel 440.

Figure 5:
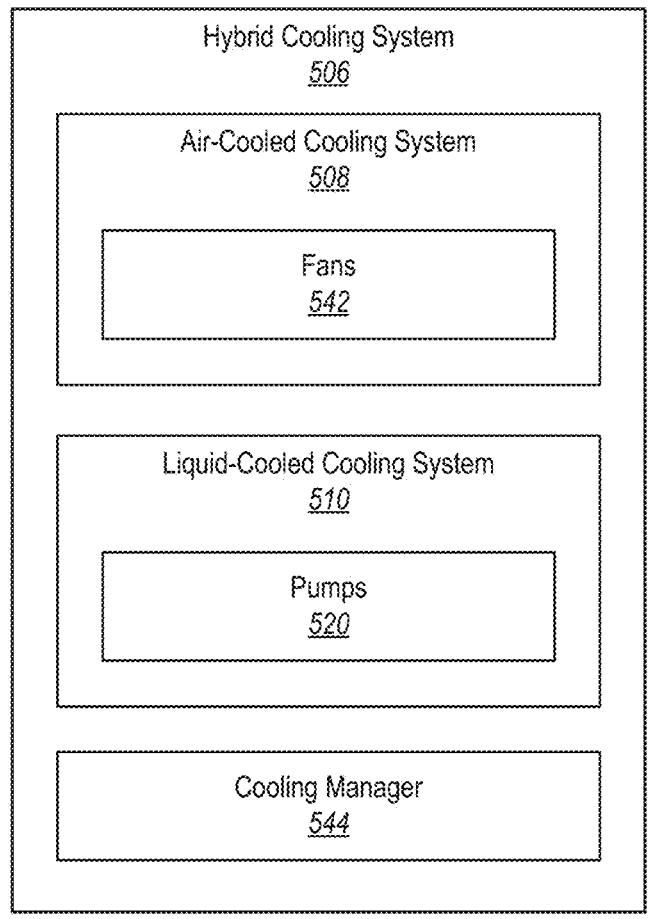
FIG. 5 is a representation of a hybrid cooling system 506, according to at least one embodiment of the present disclosure.

FIG. 5 is a representation of a hybrid cooling system 506, according to at least one embodiment of the present disclosure. Each of the components of the hybrid cooling system 506 can include software, hardware, or both. For example, the components can include one or more instructions stored on a computer-readable storage medium and executable by processors of one or more computing devices, such as a client device or server device. When executed by the one or more processors, the computer-executable instructions of the hybrid cooling system 506 can cause the computing device(s) to perform the methods described herein. Alternatively, the components can include hardware, such as a special-purpose processing device to perform a certain function or group of functions. Alternatively, the components of the hybrid cooling system 506 can include a combination of computer-executable instructions and hardware.

Furthermore, the components of the hybrid cooling system 506 may, for example, be implemented as one or more operating systems, as one or more stand-alone applications, as one or more modules of an application, as one or more plug-ins, as one or more library functions or functions that may be called by other applications, and/or as a cloud-computing model. Thus, the components may be implemented as a stand-alone application, such as a desktop or mobile application. Furthermore, the components may be implemented as one or more web-based applications hosted on a remote server. The components may also be implemented in a suite of mobile device applications or "apps."

The hybrid cooling system 506 may include an air-cooled cooling system 508 and a liquid-cooled cooling system 510. The air-cooled cooling system 508 may include one or more fans 542. The fans 542 may blow ventilation air across one or more air-cooling radiators to remove heat from the system. The liquid-cooled cooling system 510 may include one or more pumps 520. The one or more pumps 520 may circulate a cooling fluid throughout the liquid-cooled cooling system 510.

The hybrid cooling system 506 may further include a cooling manager 544. The cooling manager 544 may control actuation of one or both of the air-cooled cooling system 508 and the liquid-cooled cooling system 510. For example, the cooling manager 544 may control actuation of the fans 542 of the air-cooled cooling system 508. During operation of the computing device, the cooling manager 544 may cause the fans 542 to blow air across the air-cooling radiator. In some embodiments, the cooling manager 544 may turn on and off the fans based on one or more air-cooling criteria. The air-cooling criteria may include any operating situation. For example, the air-cooling criteria may include a temperature threshold of the heat-generating component and/or the heat sink. In some examples, the air-cooling criteria may include a utilization threshold of the heat-generating component. In some embodiments, the air-cooling criteria may include whether the computing device is connected to power or not.

In some embodiments, the cooling manager 544 controls actuation of the liquid-cooled cooling system 510 by turning on and off the pumps 520. The cooling manager 544 may control actuation of the liquid-cooled cooling system 510 based on one or more liquid-cooling criteria. For example, the cooling manager 544 may actuate the liquid-cooled cooling system 510 whenever the air-cooled cooling system 508 is actuated. In some examples, the liquid-cooling criteria include a temperature threshold of the heat-generating component, the heat sink, the cold plate, and combinations thereof. In some examples, the liquid-cooling criteria may include a utilization threshold of the heat-generating component. In some embodiments, the liquid-cooling criteria may include whether the computing device is connected to power or not.

In some embodiments, the cooling manager 544 actuates the air-cooled cooling system 508 and the liquid-cooled cooling system 510 independently of each other. For example, the air-cooling criteria may be different from the liquid-cooling criteria. The cooling manager 544 may actuate the liquid-cooled cooling system 510 when the heat generation by the heat-generating component meets or exceeds the cooling capacity of the air-cooled cooling system 508. In this manner, the liquid-cooled cooling system 510 may be to provide additional cooling for the heat-generating component.

In some embodiments, the cooling manager 544 actuates the air-cooled cooling system 508 and the liquid-cooled cooling system 510 simultaneously with each other. For example, the air-cooling criteria may be the same as the liquid-cooling criteria.

In some embodiments, the cooling manager 544 controls a ventilation rate of the fans 542. For example, the cooling manager 544 may control a fan speed of the fans 542 to increase or decrease the volumetric flow rate of the flow of ventilation air. This may help to increase or decrease the cooling capacity of the air-cooled cooling system 508.

In some embodiments, the cooling manager 544 controls a pumping rate of the pumps 520. For example, the cooling manager 544 may control a pumping speed of the pumps 520 to increase or decrease the volumetric flow rate of the flow of cooling fluid. In this manner, circulating the cooling fluid may include operating the pumps 520 with a variable flow rate (e.g., a flow rate that may be selectively changed). This may help to increase or decrease the cooling capacity of the liquid-cooled cooling system 510.

Figure 6:
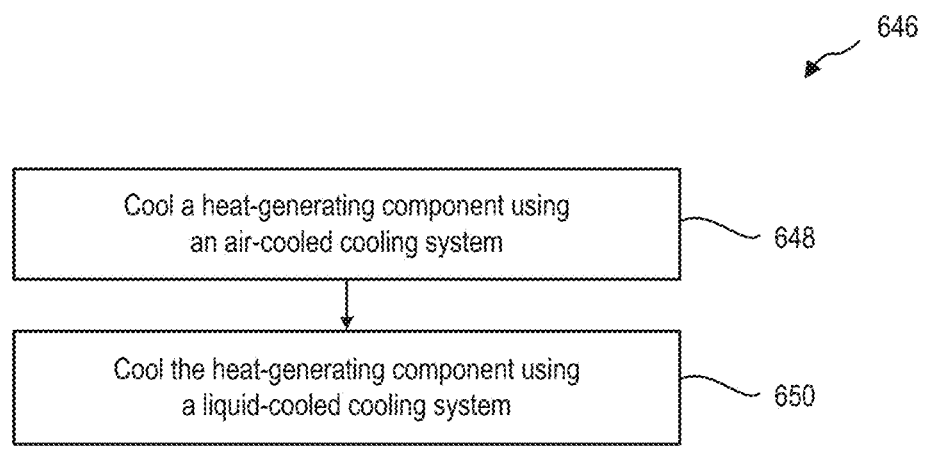
FIG. 6 is a flowchart of a method for cooling a computing device, according to at least one embodiment of the present disclosure.
Figure 7:
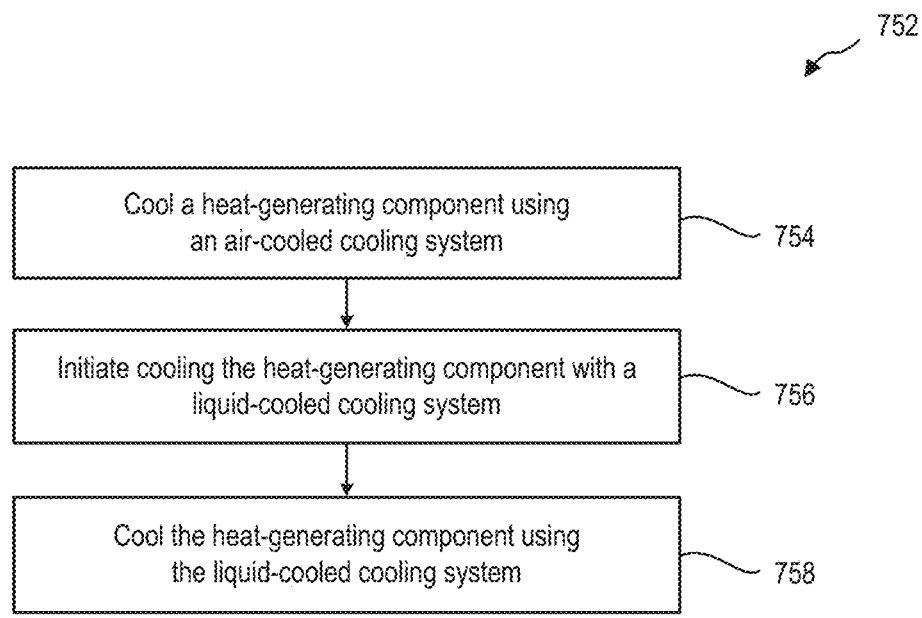
FIG. 7 is a flowchart of a method for cooling a computing device, according to at least one embodiment of the present disclosure.

FIGS. 6, 7, the corresponding text, and the examples provide a number of different methods, systems, devices, and non-transitory computer-readable media of the hybrid cooling system 506. In addition to the foregoing, one or more embodiments can also be described in terms of flowcharts comprising acts for accomplishing a particular result, as shown in FIGS. 6 and 7. FIGS. 6 and 7 may be performed with more or fewer acts. Further, the acts may be performed in differing orders. Additionally, the acts described herein may be repeated or performed in parallel with one another or parallel with different instances of the same or similar acts.

As mentioned, FIG. 6 illustrates a flowchart of a method 646 of a series of acts for cooling a computing device, in accordance with one or more embodiments. While FIG. 6 illustrates acts according to one embodiment, alternative embodiments may omit, add to, reorder, and/or modify any of the acts shown in FIG. 6. The acts of FIG. 6 can be performed as part of a method. Alternatively, a non-transitory computer-readable medium can comprise instructions that, when executed by one or more processors, cause a computing device to perform the acts of FIG. 6. In some embodiments, a system can perform the acts of FIG. 6.

The method 646 includes cooling a heat-generating component using an air-cooled cooling system at 648. Cooling the heat-generating component with the air-cooled cooling system may include blowing a flow of ventilation air across an air-cooling radiator connected to a heat sink using one or more heat pipes. The heat-generating component is further cooled using a liquid-cooled cooling system at 650. Cooling the heat-generating component using the liquid-cooled cooling system may include circulating a cooling fluid between a pump, the cold plate, and a fluid radiator.

As mentioned, FIG. 7 illustrates a flowchart of a method 752 of a series of acts for cooling a computing device, in accordance with one or more embodiments. While FIG. 7 illustrates acts according to one embodiment, alternative embodiments may omit, add to, reorder, and/or modify any of the acts shown in FIG. 7. The acts of FIG. 7 can be performed as part of a method. Alternatively, a non-transitory computer-readable medium can comprise instructions that, when executed by one or more processors, cause a computing device to perform the acts of FIG. 7. In some embodiments, a system can perform the acts of FIG. 7.

The method 752 includes cooling a heat-generating component using an air-cooled cooling system at 754. Cooling the heat-generating component with the air-cooled cooling system may include blowing a flow of ventilation air across an air-cooling radiator connected to a heat sink using one or more heat pipes.

The method 752 may further include initiating cooling the heat-generating component with a liquid-cooled cooling system at 756. The liquid-cooled cooling system may be initiated independently from the air-cooled cooling system. For example, as discussed herein, a cooling manager may initiate or actuate the liquid-cooled cooling system based on one or more liquid-cooling criteria that are different than one or more air-cooling criteria. When the liquid-cooling criteria is reached, the cooling manager may initiate the liquid-cooled cooling system by actuating the pumps to circulate the cooling through the liquid-cooled cooling system. In some embodiments, cooling manager may initiate cooling of the heat-generating component with the liquid-cooled cooling system based on a threshold heat generation. For example, if the heat generation of the heat-generating component exceeds a threshold heat generation, then the cooling manager may initiate cooling of the heat-generating component with the liquid-cooled cooling system.

After initiating cooling with the liquid-cooled cooling system, the heat-generating component is further cooled using a liquid-cooled cooling system at 758. Cooling the heat-generating component using the liquid-cooled cooling system may include circulating a cooling fluid between a pump, the cold plate, and a fluid radiator.

One or more specific embodiments of the present disclosure are described herein. These described embodiments are examples of the presently disclosed techniques. Additionally, in an effort to provide a concise description of these embodiments, not all features of an actual embodiment may be described in the specification. It should be appreciated that in the development of any such actual implementation, as in any engineering or design project, numerous embodiment-specific decisions will be made to achieve the developers' specific goals, such as compliance with system-related and business-related constraints, which may vary from one embodiment to another. Moreover, it should be appreciated that such a development effort might be complex and time consuming, but would nevertheless be a routine undertaking of design, fabrication, and manufacture for those of ordinary skill having the benefit of this disclosure.

The articles "a," "an," and "the" are intended to mean that there are one or more of the elements in the preceding descriptions. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. For example, any element described in relation to an embodiment herein may be combinable with any element of any other embodiment described herein. Numbers, percentages, ratios, or other values stated herein are intended to include that value, and also other values that are "about" or "approximately" the stated value, as would be appreciated by one of ordinary skill in the art encompassed by embodiments of the present disclosure. A stated value should therefore be interpreted broadly enough to encompass values that are at least close enough to the stated value to perform a desired function or achieve a desired result. The stated values include at least the variation to be expected in a suitable manufacturing or production process, and may include values that are within 5%, within 1%, within 0.1%, or within 0.01% of a stated value.

A person having ordinary skill in the art should realize in view of the present disclosure that equivalent constructions do not depart from the spirit and scope of the present disclosure, and that various changes, substitutions, and alterations may be made to embodiments disclosed herein without departing from the spirit and scope of the present disclosure. Equivalent constructions, including functional "means-plus-function" clauses are intended to cover the structures described herein as performing the recited function, including both structural equivalents that operate in the same manner, and equivalent structures that provide the same function. It is the express intention of the applicant not to invoke means-plus-function or other functional claiming for any claim except for those in which the words 'means for' appear together with an associated function. Each addition, deletion, and modification to the embodiments that falls within the meaning and scope of the claims is to be embraced by the claims.

The terms "approximately," "about," and "substantially" as used herein represent an amount close to the stated amount that still performs a desired function or achieves a desired result. For example, the terms "approximately," "about," and "substantially" may refer to an amount that is within less than 5% of, within less than 1% of, within less than 0.1% of, and within less than 0.01% of a stated amount. Further, it should be understood that any directions or reference frames in the preceding description are merely relative directions or movements. For example, any references to "up" and "down" or "above" or "below" are merely descriptive of the relative position or movement of the related elements.

The present disclosure may be embodied in other specific forms without departing from its spirit or characteristics. The described embodiments are to be considered as illustrative and not restrictive. The scope of the disclosure is, therefore, indicated by the appended claims rather than by the foregoing description. Changes that come within the meaning and range of equivalency of the claims are to be embraced within their scope.

What is claimed is:

1. A cooling system for a computing device, comprising:
   an air-cooled cooling system located in a housing, the air-cooled cooling system including:
      a heat sink thermally connected to a heat-generating component;
      an air-cooling radiator; and
      a heat pipe connecting the heat sink to the air-cooling radiator; and
   a liquid-cooled cooling system located in the housing, the liquid-cooled cooling system including:
      a cold plate thermally connected to a to the heat sink;
      a pump;
      a fluid radiator; and
      a fluid piping system connecting the pump, the cold plate, and the fluid radiator.

2. The cooling system of claim 1, wherein the liquid-cooled cooling system is entirely located within the housing.

3. The cooling system of claim 1, wherein the cold plate, the pump, the fluid radiator, and the fluid piping system are a closed-loop system.

4. The cooling system of claim 1, wherein the fluid radiator includes a heat exchanger.

5. The cooling system of claim 1, wherein the fluid radiator is different than the air-cooling radiator.

6. The cooling system of claim 1, wherein the fluid piping system includes:
   a cold fluid line from the pump to the cold plate;
   a hot fluid line from the cold plate to the fluid radiator; and
   a pump inlet from the fluid radiator to the pump.

7. The cooling system of claim 1, wherein the air-cooled cooling system further includes a fan configured to blow ventilation air across the air-cooling radiator.

8. The cooling system of claim 1, wherein the liquid-cooled cooling system is independently actuatable.

9. A computing system, comprising:
   a housing;
   a heat-generating component located in the housing;
   a heat sink thermally connected to the heat-generating component;
   an air-cooling radiator located in the housing, the air-cooling radiator being thermally connected to the heat-generating component via a heat pipe;
   a cold plate thermally connected to the heat sink; and
   a fluid radiator located in the housing, the fluid radiator being thermally connected to the cold plate though a fluid piping system.

10. The computing system of claim 9, further comprising a pump connected to the cold plate and fluid radiator through the fluid piping system.

11. The computing system of claim 10, wherein the pump, the fluid piping system, the cold plate, and the fluid radiator form a closed-loop system.

12. The computing system of claim 10, wherein the pump, the fluid piping system, the cold plate, and the fluid radiator are entirely located in the housing.

13. The computing system of claim 9, wherein the heat-generating component includes a dual in-line memory module (DIMM).

14. The computing system of claim 9, wherein the heat sink and the cold plate are connected to the housing using a set of mechanical fasteners.

15. A method for cooling a computing device, comprising:
   cooling a heat-generating component using an air-cooled cooling system, the air-cooled cooling system including a heat sink thermally connected to the heat-generating component and an air-cooling radiator thermally connected to the heat sink through a heat pipe, the air-cooled cooling system being located in a housing; and
   cooling the heat-generating component using a liquid-cooled cooling system, the liquid-cooled cooling system including a cold plate thermally connected to the heat sink, the liquid-cooled cooling system being located in the housing.

16. The method of claim 15, wherein cooling the heat-generating component using the liquid-cooled cooling system including circulating a cooling fluid between a pump, the cold plate, and a fluid radiator located in the housing.

17. The method of claim 16, wherein circulating the cooling fluid includes operating the pump with a variable flow rate.

18. The method of claim 15, further comprising initiating cooling the heat-generating component with the liquid-cooled cooling system independently from the air-cooled cooling system.

19. The method of claim 18, wherein initiating cooling the heat-generating component with the liquid-cooled cooling system includes initiating based on a liquid-cooling criteria that is different than an air-cooling criteria.

20. The method of claim 18, wherein initiating cooling the heat-generating component with the liquid-cooled cooling system includes initiating based on a threshold heat generation.

* * * * *